United States Patent
Wu et al.

(10) Patent No.: US 7,183,596 B2
(45) Date of Patent: Feb. 27, 2007

(54) COMPOSITE GATE STRUCTURE IN AN INTEGRATED CIRCUIT

(75) Inventors: I-Lu Wu, Hsin-Chu (TW); Kuang-Hsin Chen, Jung-Li (TW); Liang-Kai Han, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/158,764

(22) Filed: Jun. 22, 2005

(65) Prior Publication Data

US 2006/0289920 A1    Dec. 28, 2006

(51) Int. Cl.
  *H01L 29/76* (2006.01)
(52) U.S. Cl. ............... 257/213; 257/310; 257/388; 257/412; 257/E29.242; 257/E29.272
(58) Field of Classification Search ........ 257/388–413, 257/310, 213, 288, 296, E29.242, E29.255, 257/E29.272, E21.4
See application file for complete search history.

(56) References Cited

U.S. PATENT DOCUMENTS

| | | | |
|---|---|---|---|
| 5,321,289 A | 6/1994 | Baba et al. | |
| 5,668,035 A | 9/1997 | Fang et al. | |
| 6,013,553 A | 1/2000 | Wallace et al. | |
| 6,015,739 A | 1/2000 | Gardner et al. | |
| 6,030,862 A | 2/2000 | Kepler | |
| 6,166,417 A * | 12/2000 | Bai et al. | 257/407 |
| 6,168,958 B1 | 1/2001 | Gardner et al. | |
| 6,265,325 B1 | 7/2001 | Cao et al. | |
| 6,303,418 B1 | 10/2001 | Cha et al. | |
| 6,383,861 B1 | 5/2002 | Gonzalez et al. | |
| 6,432,776 B1 | 8/2002 | Ono | |
| 6,448,127 B1 | 9/2002 | Xiang et al. | |
| 6,479,341 B1 | 11/2002 | Lu | |
| 6,495,422 B1 | 12/2002 | Yu et al. | |

(Continued)

FOREIGN PATENT DOCUMENTS

TW          426941          3/2001

OTHER PUBLICATIONS

Chen, C.-H., et al., "Downscaling Limit of Equivalent Oxide Thickness in Formation of Ultrathin Gate Dielectric by Thermal-Enhanced Remote Plasma Nitridation," IEEE Transactions on Electron Devices, vol. 49, No. 5, May 2002, pp. 840-846.

(Continued)

*Primary Examiner*—Brook Kebede
(74) *Attorney, Agent, or Firm*—Slater & Matsil, L.L.P.

(57) ABSTRACT

An integrated circuit having composite gate structures and a method of forming the same are provided. The integrated circuit includes a first MOS device, a second MOS device and a third MOS device. The gate stack of the first MOS device includes a high-k gate dielectric and a first metal gate on the high-k gate dielectric. The gate stack of the second MOS device includes a second metal gate on a high-k gate dielectric. The first metal gate and the second metal gate have different work functions. The gate stack of the third MOS device includes a silicon gate over a gate dielectric. The silicon gate is preferably formed over the gate stacks of the first MOS device and the second MOS device.

9 Claims, 5 Drawing Sheets

U.S. PATENT DOCUMENTS

| | | | |
|---|---|---|---|
| 6,528,374 | B2 | 3/2003 | Bojarczuk, Jr. et al. |
| 6,528,858 | B1 | 3/2003 | Yu et al. |
| 6,621,114 | B1 | 9/2003 | Kim et al. |
| 6,632,714 | B2 | 10/2003 | Yoshikawa |
| 6,640,403 | B2 | 11/2003 | Shih et al. |
| 6,777,761 | B2 | 8/2004 | Clevenger et al. |
| 6,906,398 | B2 | 6/2005 | Yeo et al. |
| 6,927,414 | B2 | 8/2005 | Ouyang et al. |
| 2004/0198009 | A1 | 10/2004 | Chen et al. |
| 2006/0011949 | A1* | 1/2006 | Yang et al. ............. 257/204 |
| 2006/0024893 | A1* | 2/2006 | Min et al. ............... 438/287 |

OTHER PUBLICATIONS

Yeo, Y.-C., et al., "Direct Tunneling Leakage Current and Scalability of Alternative Gate Dielectrics," Applied Physics Letters, vol. 81, No. 11, Sep. 9, 2002, pp. 2091-2093.

Mahapatra, R., et al., "$ZrO_2$ as a High-k Dielectric for Strained SiGe MOS Devices," Bull. Mater. Sci., vol. 25, No. 6, pp. 455-457.

Gustafsson, T., et al., "High-Resolution Depth Profiling of Ultrathin Gate Oxides Using Medium-Energy Ion Scattering," Nuclear Instruments and Methods in Physics Research, B 183, 2001, pp. 146-153

"Bake and Cure of Low-k Dielectric Layers," Koyo Thermo Systems Co., Ltd., http://www.crystec.com/killowe.htm.

* cited by examiner

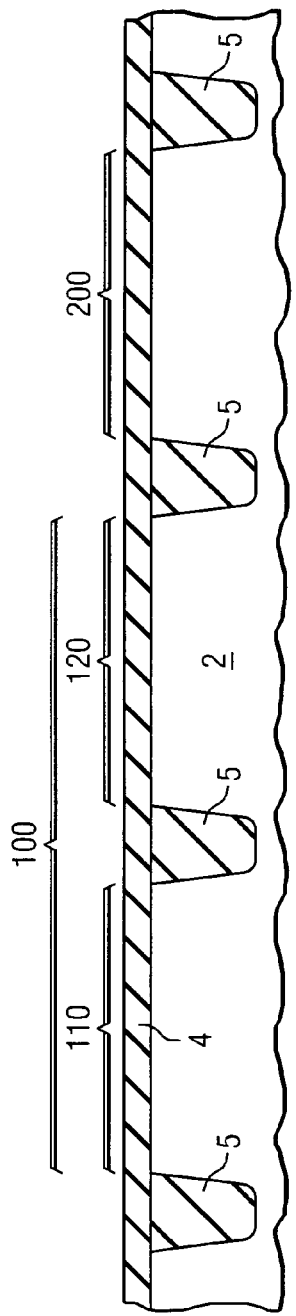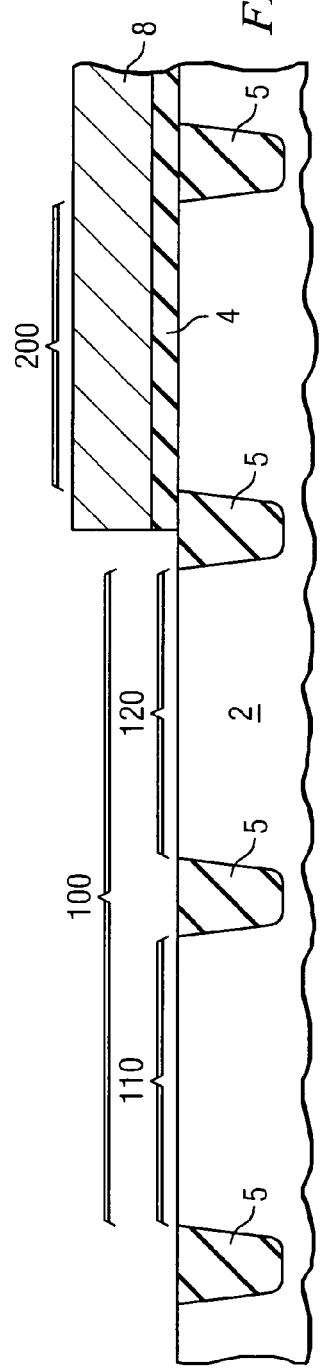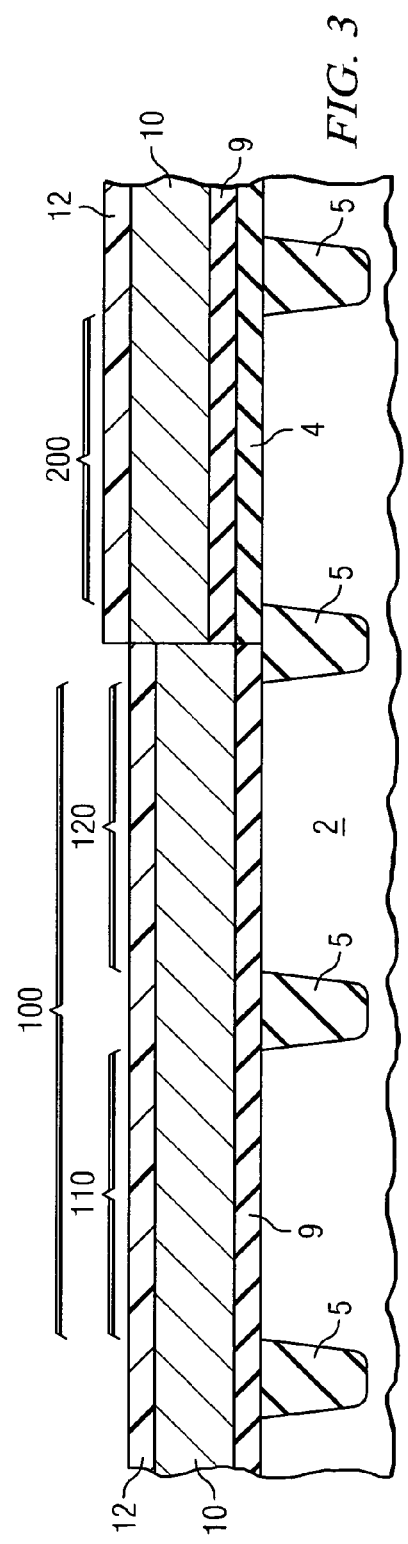

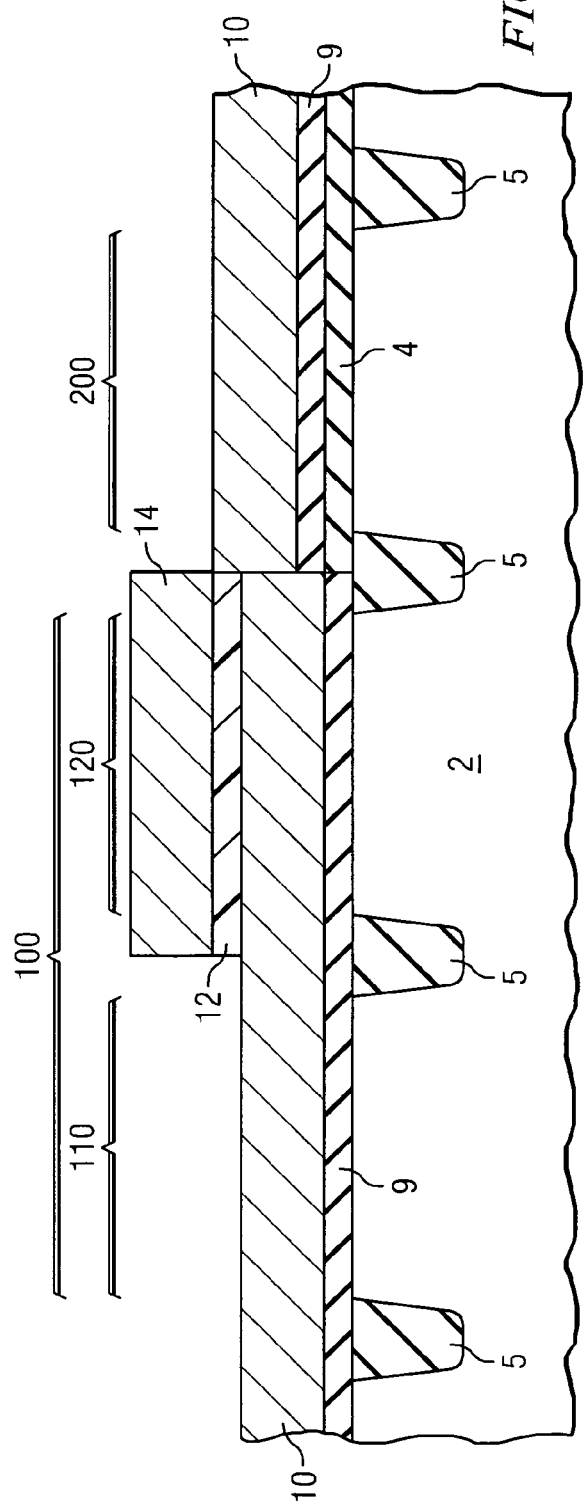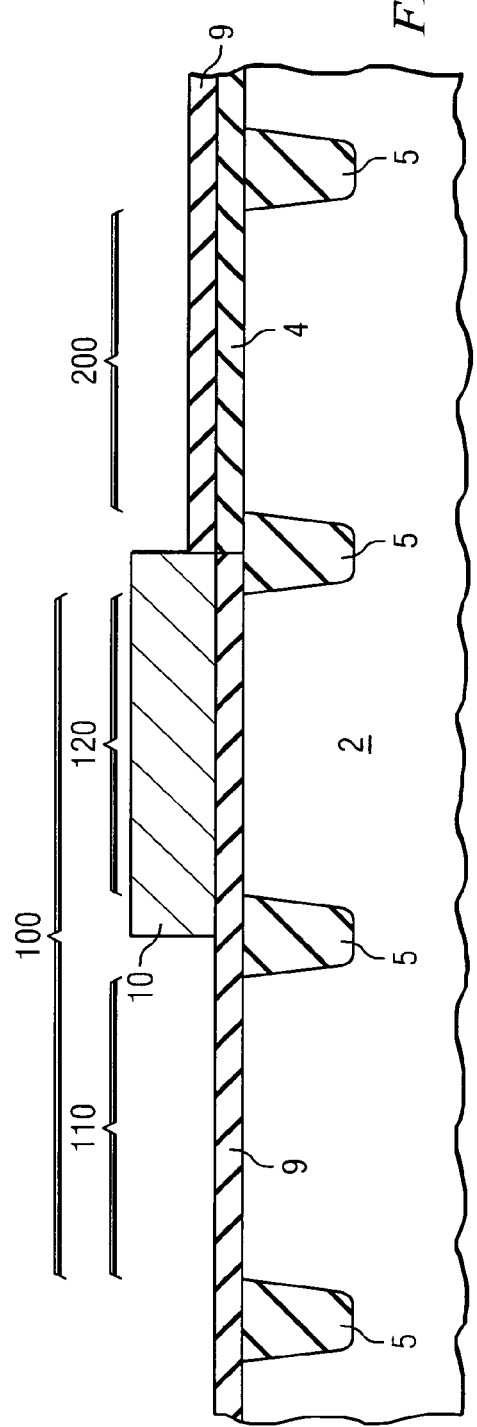

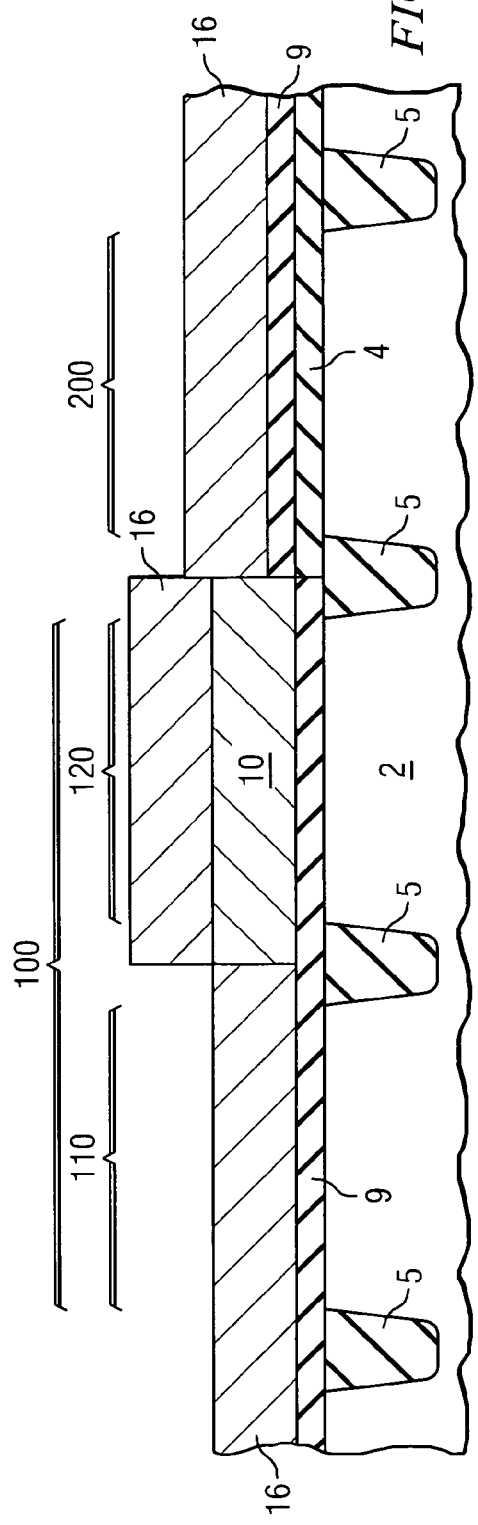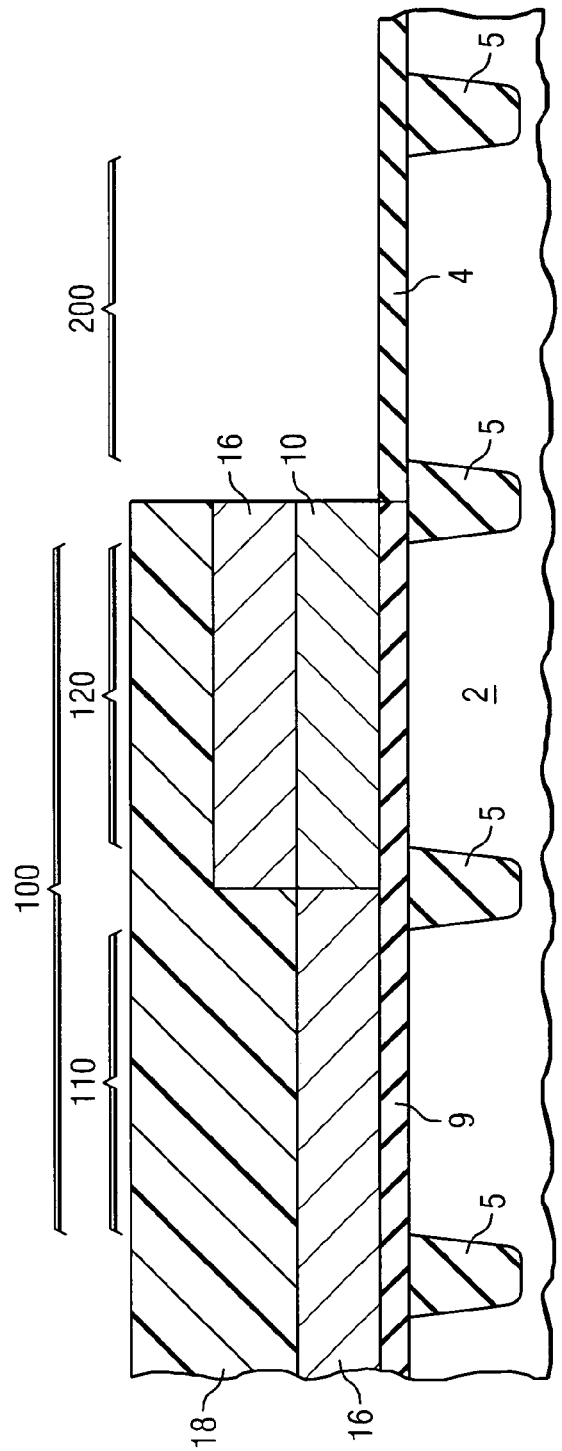

COMPOSITE GATE STRUCTURE IN AN INTEGRATED CIRCUIT

CROSS-REFERENCE TO RELATED APPLICATIONS

This application relates to the following co-pending and commonly assigned patent application: U.S. patent application Ser. No. 10/832,020, filed Apr. 26, 2004, entitled "Semiconductor Device with High-K Gate Dielectric", which application is incorporated herein by reference.

TECHNICAL FIELD

This invention relates generally to semiconductor devices, and more specifically to the gate formation of MOS devices.

BACKGROUND

CMOS has been the basic logic building block in the digital-dominant world for decades. Device dimensions have been continuously shrunk in order to achieve higher performance as well as higher packing density. Technology advancement demands more and more functions to be integrated on a single chip, and thus one MOS design cannot fulfill all requirements in an integrated circuit. For example, in a traditional circuit that employs micron technology or earlier technologies, the operation voltage of the core circuit was typically in a range of about 2.5 V to 3.3 V. However, as the integrated circuit size continues to shrink, the core operation voltage is lowered. When the deep sub micron technology is employed, the size of a circuit is further reduced to about 0.25, 0.18 or even 0.13 micron, and the operation voltage drops to around 1 V. It is expected that the core operation voltage will continue to fall when the integrated circuit size continues to shrink. While the core operation voltage falls, the operation voltage of the I/O circuit often stays at a higher value. As a result, the MOS devices in the I/O circuit and the core circuit are expected to work under different operation voltages.

Scaling of the integrated circuit also causes other problems. In traditional IC processes, gate electrodes are typically formed of polysilicon. One of the reasons for polysilicon's wide use is that the work function of polysilicon gate electrodes can be changed easily by doping with different impurities. However, polysilicon has depletion problems, so metal gate electrodes were introduced, particularly for device formation in core regions, to avoid the poly depletion phenomenon.

Previously discussed issues demand customized manufacturing processes. U.S. Pat. No. 6,432,776 provides an integrated circuit having a core section and an I/O section. A device in the core section includes a metal gate and a thin oxide gate dielectric, while a device in the I/O section has a polysilicon gate and a thick oxide gate dielectric. U.S. Pat. No. 6,777,761 also discloses an integrated circuit having two regions. In a first region, a device comprises a pure metal gate and an oxide gate dielectric. In a second region, a device comprises a polysilicon gate and an oxide gate dielectric.

By using these prior art solutions, one part of a chip can have a device with a reliable, high-yield polysilicon gate, while the other part of the chip can have a high-performance MOS device with a metal gate. These integrated circuits and manufacturing processes, however, have a potential problem. Typically, metal gates are thinner than polysilicon gates to alleviate the difficulties associated with the metal etching process and to improve the gate stack profile control, thus there is a step height between the top surfaces of the metal gates and the polysilicon gates. Additionally, gate dielectrics in the core region are typically thinner than gate dielectrics in the I/O region, further increasing the step height. This step height adds complexity and cost for subsequent manufacturing processes.

SUMMARY OF THE INVENTION

In accordance with one aspect of the present invention, a method of forming an integrated circuit having composite gate structures includes providing a substrate having a first region and a second region, wherein the first region further comprises a third region and a fourth region. A high-k dielectric layer is formed on the substrate in the third and fourth regions. A first metal layer having a first work function is formed over the high-k dielectric in the third region, and a second metal layer having a second work function is formed over the high-k dielectric in the fourth region. The method further includes forming a gate oxide layer on the substrate in the second region and a silicon layer over the gate oxide layer. The high-k dielectric layer and the first metal layer in the third region are patterned to form a first gate stack of a first MOS device. The high-k dielectric layer and the second metal layer in the fourth region are patterned to form a second gate stack of a second MOS device, and the gate oxide layer and the silicon layer in the second region are patterned to form a third gate stack of a third MOS device. The first and second MOS devices are preferably used as core region devices. The third MOS device is preferably used as an I/O circuit device or other peripheral circuit device.

In accordance with another aspect of the present invention, the silicon layer is formed over the first metal layer and the second metal layer and is patterned as respective portions of the first gate stack and the second gate stack. Preferably, the second metal layer is formed in the third region and over the first metal layer.

In accordance with another aspect of the present invention, an integrated circuit having composite gate structures includes a first MOS device, a second MOS device and a third MOS device. The gate stack of the first MOS device includes a high-k gate dielectric and a first metal gate on the high-k gate dielectric. The gate stack of the second MOS device includes a second metal gate on the high-k gate dielectric. The first metal gate and the second metal gate have different work functions. The gate stack of the third MOS device includes a silicon gate over a gate oxide.

In accordance with yet another aspect of the present invention, the first MOS device is an nMOS device, and the first metal gate has a work function of less than about 4.6 eV. The second MOS device is a pMOS device, and the second metal gate has a work function of greater than about 4.8 eV. The balanced work functions improve the performance of the integrated circuit.

In accordance with yet another aspect of the present invention, each of the gate stacks of the first and second MOS devices further includes a silicon portion over the respective first metal gate and second metal gate. The step heights between the gate stacks of different devices are reduced by adding the silicon portion. Preferably, the gate stack of the second device further includes an additional metal gate over the first metal gate, and the additional metal gate is simultaneously formed as the second metal gate of the second MOS device is formed.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1 through 10 are cross-sectional views of intermediate stages in the manufacture of a MOS transistor embodiment.

DETAILED DESCRIPTION OF ILLUSTRATIVE EMBODIMENTS

Figure 8:
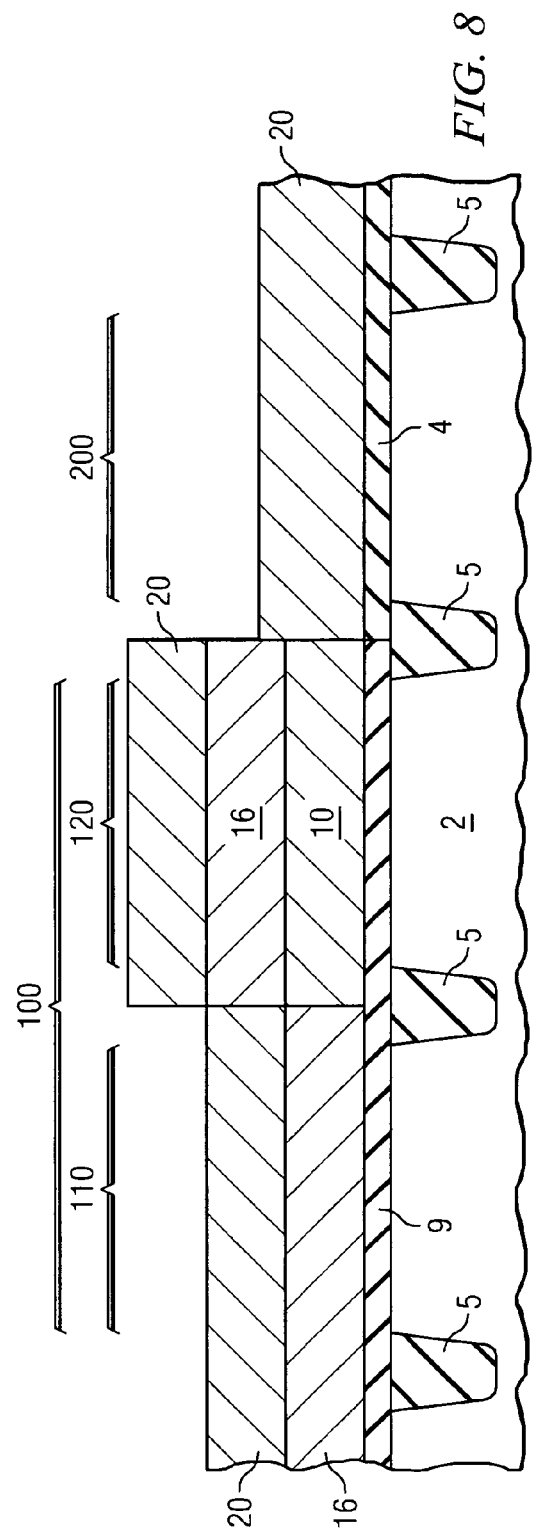

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the preferred embodiments of the present invention, a chip includes two regions, a first region and a second region. The devices in the first region and the second region have different designs and thus are customized for different functions. For example, the first region may be a core region wherein high performance is required, and the second region may be a peripheral region such as an I/O region, an analog region, a high voltage device region, or a region for devices such as polysilicon resistors, decoupling capacitors, etc.

The preferred embodiments are illustrated in FIGS. 1 through 10 wherein like reference numbers are used to designate like elements throughout the various views and illustrative embodiments of the present invention. Throughout the description, each element number may be followed by a letter A, B, or C, indicating that the corresponding device is formed in the third, fourth, and second regions, respectively.

FIG. 1 illustrates a gate oxide 4 formed on a substrate 2. Shallow trench isolations 5 are formed to divide the substrate 2 into a first region 100 and a second region 200. The first region 100 further includes a third region 110 for forming an nMOS device and a fourth region 120 for forming a pMOS device. The substrate 2 can be formed of common semiconductor containing substrate materials such as silicon, SiGe, strained silicon on SiGe, silicon on insulator (SOI), silicon germanium on insulator (SGOI), germanium on insulator (GOI), GaAs, InP, and the like. The substrate 2 may further comprise an interfacial layer (not shown) to prevent the inter-diffusion of undesired elements between semiconductor substrate 2 and a subsequently formed high-k dielectric layer. Although the gate oxide 4 is referred to as an oxide, as it is typically formed of, it may comprise other materials. In the preferred embodiment, the gate oxide 4 includes $SiO_2$ formed by a thermal growth technique in a wet or dry environment, or grown by a chemical vapor deposition (CVD) technique such as low temperature CVD (LTCVD), low pressure CVD (LPCVD), plasma enhanced CVD (PECVD), atomic layer deposition (ALD), etc. In other embodiments, it comprises oxynitrides or nitrogen containing dielectrics, and may have an oxide-nitride-oxide (ONO) structure.

FIG. 2 illustrates the removal of the gate oxide 4 from the region 100. A photo resist 8 is formed in the region 200 as a mask. The gate oxide 4 in the region 100 is removed, preferably by wet etching using HF containing chemicals at temperatures lower than about 110° C., exposing the surface of substrate 2. The photo resist 8 is then removed.

A high-k dielectric layer 9, a metal layer 10 and a hard mask 12 are then deposited, as illustrated in FIG. 3. The high-k dielectric layer 9 preferably has a k value of greater than about 4, more preferably greater than about 8, and even more preferably greater than about 10. The thickness is preferably less than about 150 Å, and more preferably between about 20 Å and about 70 Å. In the preferred embodiment, the high-k dielectric layer 9 is formed of $HfO_2$. In other embodiments, the dielectric layer 9 comprises silicates such as $HfSiO_4$, HfSiON, HfSiN, $ZrSiO_4$, ZrSiON, ZrSiN, and the like, or metal oxides such as $Al_2O_3$, $ZrO_2$, $HfO_2$, $Y_2O_3$, $La_2O_3$, $TiO_2$, $Ta_2O_5$, and the like. Other materials such as metal nitride, transition metal oxide, and transition metal silicate can also be used. In some embodiments, the high-k dielectric layer 9 may have a composite structure with more than one layer, and each layer may be formed of any of the previously discussed materials. The methods of forming the high-k dielectric layer 9 includes commonly used methods such as chemical vapor deposition (CVD), atomic layer deposition (ALD), plasma enhanced CVD (PECVD), physical vapor deposition (PVD), etc.

The metal layer 10 preferably has a high work function, more preferably of greater than about 4.8 eV. Preferably, high work function metals such as nickel, rhenium, platinum, ruthenium, etc., metal nitrides such as MoN, TaCN, TiAlN, and metal silicides such as $MoSi_2$, HfSi, NiSi, etc., are used. The preferred thickness of the metal layer 10 is between about 20 Å and about 300 Å. The preferred methods for forming the metal layer 10 include CVD, PVD, sputter, etc. Appropriate impurities may be doped to adjust the work function. A hard mask 12, preferably formed of tetra ethyl ortho silicate (TEOS), is formed over the metal layer 10.

A photo resist 14 is formed in region 120, as shown in FIG. 4. The unprotected hard mask 12 in regions 110 and 200 is removed using the photo resist 14 as a mask, preferably by wet etching. The photo resist 14 is then removed. The remaining hard mask 12, which protects region 120, is used as a mask for subsequent metal removal, and the metal layer 10 is removed from regions 110 and 200, preferably by wet etching using acids such as acetic acid, nitric acid, phosphoric acid, hydrofluoric acid, hydrochloric acid, and the like. Hard mask 12 in the region 120 is then removed, and the resulting structure is shown in FIG. 5.

FIG. 6 illustrates a second metal layer 16 formed in regions 100 and 200. The metal layer 16 preferably has a work function that is lower than the work function of the metal layer 10. More preferably, the metal layer 16 has a work function of less than about 4.6 eV and may comprise metals such as aluminum, hafnium, tantalum, and titanium, etc. The metal layer 16 may also comprise metal nitrides such as TaN, TaPN, or metal silicides such as $NbSi_2$, tantalum silicide, doped HfSi and NiSi, etc. The preferred thickness of the metal layer 16 is similar to the preferred thickness of the metal layer 10, which is between about 20 Å and about 300 Å. The formation method includes CVD, PVD, sputter, etc. Impurities may be doped to change the work function of the metal layer 16.

As shown in FIG. 7, a photo resist 18 is formed in region 100. The metal layer 16 in region 200 is removed, preferably by wet etching using acids such as acetic acid, nitric acid, phosphoric acid, hydrofluoric acid, hydrochloric acid, and the like. The high-k dielectric layer 9 in region 200 is also removed, preferably using a chlorine-based solvent, exposing the gate oxide layer 4. In the preferred embodiment, the photo resist 18 covers both regions 110 and 120. In alternative embodiments, photo resist 18 only covers region 110, so that the metal layer 16 in regions 120 and 200 can be removed by a selective etching that only attacks the metal layer 16, not the metal layer 10. Photo resist 18 is then removed.

Figure 9:
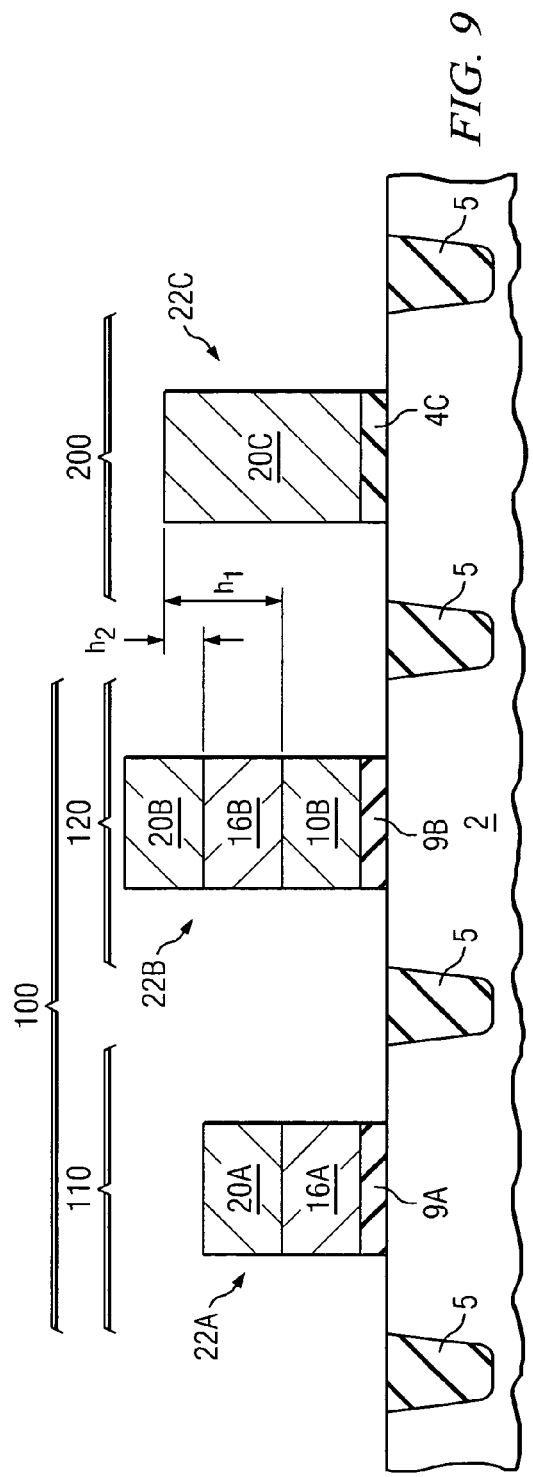

FIG. 8 illustrates the formation of a silicon layer 20. The silicon layer 20 preferably comprises polysilicon and has a preferred thickness of less than about 2500 Å, more preferably between about 500 Å and about 2000 Å, and even more preferably about 1000 Å. In FIG. 9, the previously formed layers are patterned to form gate stacks 22A, 22B, and 22C in regions 110, 120, and 200, respectively. In the preferred embodiment, the gate stacks 22A, 22B, and 22C are patterned and etched using ion bombardment combined with chemical reaction. The silicon gate 20C may be doped to have different work functions depending on whether a pMOS device or an NMOS device is to be formed. It may also be doped to have a mid-gap work function, which is between about 4.6 eV and about 4.8 eV, regardless of the type of device to be formed. In alternative embodiments, layer 20 comprises amorphous silicon.

Figure 10:
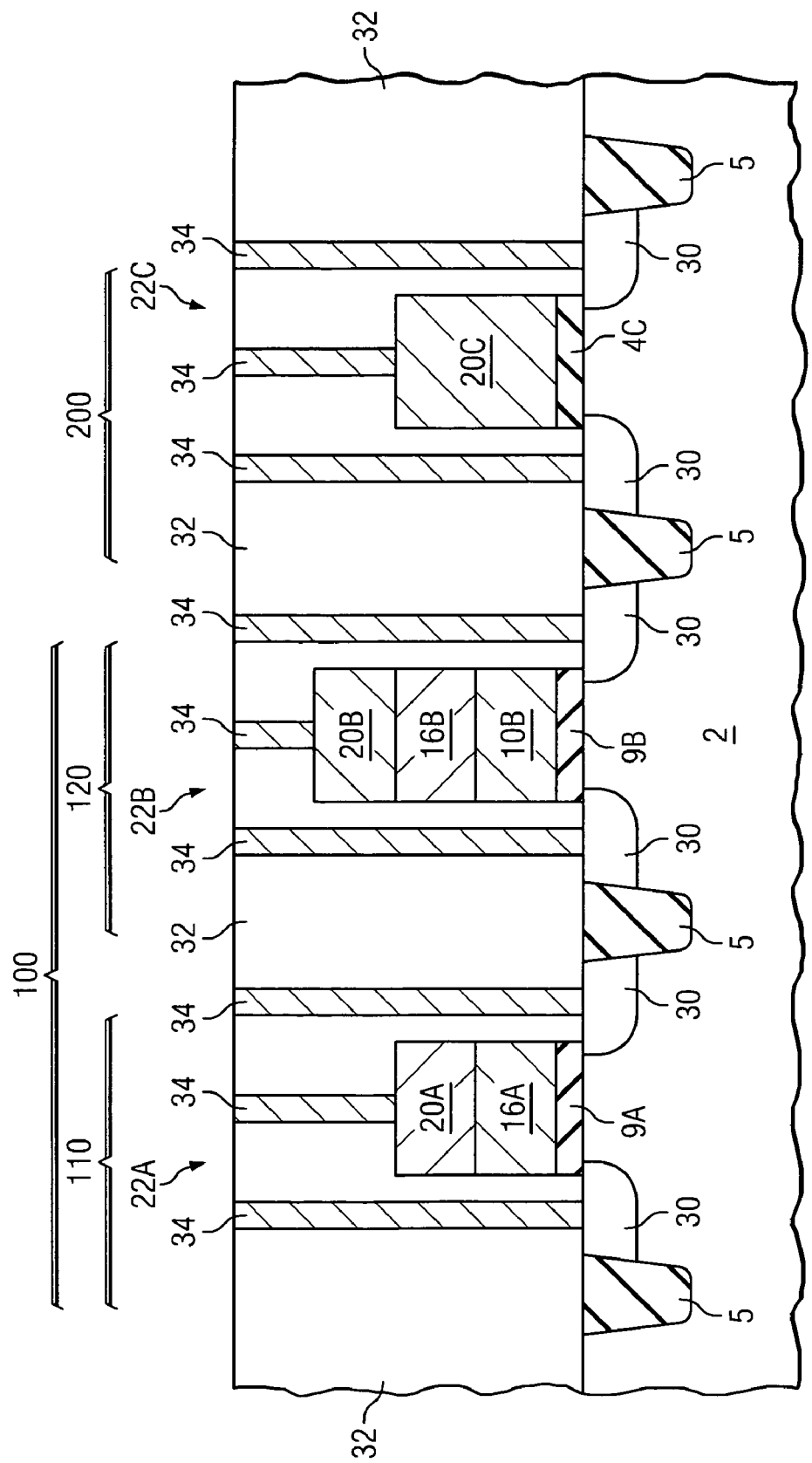

Source/drain regions 30, inter-layer dielectric 32 and contact plugs 34 are then formed for each device in the regions 110, 120, and 200. FIG. 10 illustrates the resulting structure. The formation of these components is well known in the art and thus is not repeated.

In the preferred embodiments, a dual metal scheme, in which different metals are adopted for nMOS devices and pMOS devices in the core region 100, is used in order to achieve symmetric and low threshold voltages ($V_{th}$) for both nMOS and pMOS devices. This is particularly beneficial for very small-scale devices such as ultra-thin body MOS devices formed on silicon-on-insulator (SOI) or Fin field-effect transistors (FinFET), where channel implant has less effect on adjusting threshold voltages, and thus the low threshold voltages are preferably achieved by having work functions less than about 4.6 eV for nMOS devices and greater than about 4.8 eV for pMOS devices.

Referring to FIG. 10, the respective work functions of the gate stacks 22A and 22B are preferably tuned by using different combinations of metals and dopants. Typically, for a composite gate having more than one layer of materials, the work function of the gate is influenced mainly by the layer closest to the gate dielectric, and the other layers act as conductors. Therefore, for the NMOS device in region 110, the work function of the metal gate electrode 16A is preferably lower than 4.6 eV. The work function of the pMOS device in core region 120 is mainly determined by the work function of the metal gate electrode 10B, and thus the metal gate electrode 10B preferably has a higher work function, more preferably higher than 4.8 eV. With such a design, the balanced work functions improve the performance of the device in the (core) region 100.

The requirements for devices in the second region 200 are different from that of the first region due to different function requirements. For example, the gate oxide 4C is typically formed of oxide with a greater thickness, and thus can operate with higher operation voltages. The gate electrode 20C is formed of polysilicon or amorphous silicon and is doped to adjust the work function. Mid-gap materials with work functions between about 4.6 eV and about 4.8 eV may be used.

A potential topographic problem arises when a MOS device in the first region 100 uses a metal gate only and a MOS device in the second region 200 uses a silicon gate only. Referring back to FIG. 9, since the silicon gate electrode 20C in the I/O region (region 200) is typically significantly thicker than the electrodes of the metal gates 22A and 22B, there exist step heights h1 and h2, which have typical values of several hundred angstroms or greater, between the top surfaces of the silicon gate electrode 20C and metal gates 16A and 16B, respectively. These step heights affect the subsequent processes and increase complexity and cost of manufacture. Therefore, it is advantageous to have silicon formed on the metal gates in the first region 100. The step heights will be significantly lower because the step heights will be mainly caused by the thickness of the metal gates in the core region instead of by the thickness of the silicon gates, which is significantly greater.

One skilled in the art will realize that the sequence of process steps described in the preferred embodiments can be altered. For example, the metal layer 16 can be formed before the formation of the metal layer 10, and the high-k gate dielectric layer 9 can be formed and removed from the second region 200 before the formation of the gate oxide 4.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit comprising:
    a substrate;
    a first MOS device comprising:
        a first high-k dielectric on the substrate; and
        a first metal gate having a first work function over the first high-k dielectric; a second MOS device comprising:
        a second high-k dielectric on the substrate; and
        a second metal gate having a second work function over the second high-k dielectric, the second work function being different from the first work function;
    a third MOS device comprising:
        a gate dielectric on the substrate; and
    a patterned silicon layer directly on the first metal gate, the second metal gate and the gate dielectric.

2. The integrated circuit of claim 1 wherein:
    the first MOS device is an NMOS device and the first work function is less than about 4.6 eV; and
    the second MOS device is a pMOS device and the second work function is greater than about 4.8 eV.

3. The integrated circuit of claim 1 wherein the second metal gate comprises a first metal layer and an additional metal layer, the additional metal layer comprising a same material as the first metal gate.

4. The integrated circuit of claim 1 wherein the first and the second high-k dielectrics have a k value of greater than about 8.

5. The integrated circuit of claim 1 wherein the first high-k dielectric and the second high-k dielectric comprise same materials.

6. The integrated circuit of claim 1 wherein the silicon gate has a thickness of greater than about 500 Å.

7. The integrated circuit of claim 1 wherein the first and second metal gates have thicknesses of between about 20 Å and about 300 Å.

8. The integrated circuit of claim 1 wherein the gate dielectric comprises high-k materials.

9. The integrated circuit of claim 7 wherein the substrate further comprises an interfacial layer underlying the gate dielectric.

* * * * *